United States Patent [19]
Nagaya et al.

[11] Patent Number: 5,648,743
[45] Date of Patent: Jul. 15, 1997

[54] AMPLIFYING CIRCUIT FOR AN INTEGRATED CIRCUIT WITH LOW-NOISE CHARACTERISTIC

[75] Inventors: Setsuya Nagaya, Sapporo; Hideo Sugawara; Tominaga Watanabe, both of Kawasaki, all of Japan

[73] Assignee: Fujitsu Limited, Kanagawa, Japan

[21] Appl. No.: 387,734

[22] PCT Filed: Mar. 25, 1994

[86] PCT No.: PCT/JP94/00478

§ 371 Date: Feb. 16, 1995

§ 102(e) Date: Feb. 16, 1995

[87] PCT Pub. No.: WO95/05027

PCT Pub. Date: Feb. 16, 1995

[30] Foreign Application Priority Data

Aug. 10, 1993 [JP] Japan ............................. 5-218070

[51] Int. Cl.$^6$ .......................................... H03F 3/45
[52] U.S. Cl. ............................... 330/252; 330/311
[58] Field of Search ............................. 330/252, 302, 330/310, 311, 261, 296

[56] References Cited

U.S. PATENT DOCUMENTS 4,940,949  7/1990  Landi ......................... 330/311 X

FOREIGN PATENT DOCUMENTS

| 55-72325 | 5/1980 | Japan . |
| 55-104819 | 7/1980 | Japan . |
| 57-155812 | 9/1982 | Japan . |
| 58-168308 | 10/1983 | Japan . |
| 59-104807 | 6/1984 | Japan . |
| 0123210 | 5/1991 | Japan ................................. 330/252 |

Primary Examiner—Steven J. Mottola
Attorney, Agent, or Firm—Helfgott & Karas, P.C.

[57] ABSTRACT

An amplifying circuit is suitable for an integrated circuit that has a characteristic of low-noise, high-gain, and low-consumptive current. In the circuit, transistors or FETs are used as amplifying elements. A basic amplifying circuit employing transistors, that forms a differential pair of first and second transistors, first and second resistors connected to each collector of the first and second transistors, and a constant current source connected to a common emitter of the first and second transistors, comprises a third transistor, of which emitter is connected to a connecting point of the first and second resistors, a condenser connected between a connecting point of the first transistor and the first resistor, or a connecting point of the second transistor and the second resistor, and a base of the third transistor, and a voltage source connected to a collector of the third transistor, wherein outputs are obtained from an emitter of the third transistor.

14 Claims, 16 Drawing Sheets

AMPLIFYING CIRCUIT FOR AN INTEGRATED CIRCUIT WITH LOW-NOISE CHARACTERISTIC

BACKGROUND OF THE INVENTION

1. Field of the Invention

The present invention relates to an amplifying circuit. More particularly, it relates to an amplifying circuit, which is suitable for an integrated circuit with the low-noise, high gain and low power consumption characteristics.

2. Description of the Prior Art

In recent years, movable communication terminals, such as a portable telephone, are spreading extensively. According to this fact, there is a demand for making a circuit of high frequency characteristic used for movable communication terminals, such as a portable telephone, micro-miniaturized. Moreover, there is also a demand for making an amplifying circuit, which has been composed of individual parts integrated.

Further, most of the movable communication terminals, such as a portable telephone, are driven with batteries. Accordingly, it is required to reduce current consumption for lengthening the period of life of a battery.

FIG. 19 is one structural example of a conventional transistor amplifying circuit.

In the diagram, a constant-current source $I_0$ and a condenser $C_E$ connected to the constant-current source in parallel are connected to the emitter of a first transistor $Q_1$. Also, a voltage source $V_{CC}$ is connected to the collector of the transistor $Q_1$, via a load-resistor $R_C$. A bias voltage $V_{BB}$ is supplied to the base of the transistor $Q_1$.

Further, the conventional transistor amplifying circuit includes a second transistor $Q_2$, of which the collector is connected to the voltage $V_{CC}$ and the emitter is connected to a resistor $R_E$. Furthermore, an output from the collector of the first transistor $Q_1$ is connected to the base of the second transistor $Q_2$.

Moreover, the base of the transistor $Q_1$ is used as an input terminal of a high-frequency signal, and the emitter of the transistor $Q_2$ is used as an output terminal of the high-frequency signal. In this circuit, the transistor $Q_1$ is an amplifying circuit of an emitter grounded type, and the transistor $Q_2$ forms an emitter follower circuit for matching impedance with the circuit arranged behind the emitter follower circuit.

FIG. 20 further illustrates a structural example of the conventional transistor amplifying circuit including a bias circuit section 21. As is apparent from FIG. 20, the transistor amplifying circuit is composed of the amplifying circuit section 20 and the bias circuit section 21 for supplying a bias voltage required to each portion of the amplifying circuit.

In FIG. 20, the amplifying circuit section 20 corresponds to the transistor amplifying circuit shown in FIG. 19. The amplifying circuit section has a transistor $Q_3$ and a resistor $R_{E1}$, instead of the current source $I_0$ shown in FIG. 19 and a transistor $Q_1$ and a resistor $R_{E2}$, instead of the resistor $R_E$ shown in FIG. 19.

The bias circuit section 21 shown in FIG. 20 supplies bias current source, that is, base potential of the transistors $Q_1$, $Q_2$, $Q_3$, and $Q_4$, required for the amplifying circuit section 20 positioned on the right side of the circuit of FIG. 20. The bias circuit section 21 is composed of a 2-line structured constant current circuit which has three transistors $Q_{B1}$ to $Q_{B3}$, and three transistors $Q_{B4}$ to $Q_{B6}$ laid lengthwise, respectively. Further, the transistors $Q_{B2}$ to $Q_{B3}$ and $Q_{B5}$ to $Q_{B6}$ function as diodes by connecting the bases and the collectors in common.

Meanwhile, in the transistor amplifying circuit of an emitter grounded type shown in FIGS. 19 and 20, noise amount (NF) of the circuit is generally proportional to the resistance of base resistor $R_b$ of a transistor used. Further, it is generally known that noise amount (NF) is inversely proportional to the second power of $f_t$ (cutoff frequency) of a transistor.

In FIGS. 19 and 20, a resistor $R_C$ is a collector load resistor of transistor $Q_1$, which is an amplifying element. At the same time, the resistor $R_C$ also has a function of dropping the voltage to a suitable base potential of the transistor $Q_2$ of the emitter follower circuit, which follows the transistor $Q_1$.

In the above-described transistor amplifying circuit shown in FIGS. 19 and 20, collectors of the transistors $Q_1$ and $Q_2$ are connected to the voltage source $V_{CC}$, respectively. Therefore, a consumption current of the amplifying circuit becomes the sum $(I_1+I_2)$ of the current $I_1$, flowing into the transistor $Q_1$ and the current $I_2$ flowing into the transistor $Q_2$.

Thus, when making the consumption current lower in this circuit, it becomes necessary to reduce both, the current $I_1$ and the current $I_2$. Accordingly, it brings a problem that the performance of the circuit is not sufficiently fulfilled in the case where the circuit is used as an amplifying circuit. Or, it brings another problem that the consumption current becomes large in the case where a satisfactory performance is obtained.

It also becomes necessary to have two rows of the circuits forming the bias circuit section 21, in FIG. 20. Therefore, the consumption current in the bias circuit section 21 becomes the sum $(I_{B1}+I_{B2})$ of the currents $I_{B1}$ and $I_{B2}$, which respectively flow to each of constant current circuits, as well as in the amplifying circuit section 20. Accordingly, the circuit can not make the current amount lower.

Further, the base resistor $R_b$ of the grounded-emitter type transistor $Q_1$ is practically determined according to the physical forms of individual transistors in general. Furthermore, the cutoff frequency $f_t$ is also determined according to the semiconductor process technique for manufacturing transistors.

If the current of the transistor amplifying circuit is made lower, there is a tendency that the cutoff frequency $f_t$ becomes lower and the noise amount becomes worse.

The $V_{ce}$ (voltage between the collector and the emitter) of the transistor $Q_1$ becomes smaller because of the voltage drop with the load resistor $R_c$. It is generally known that the cutoff frequency $f_t$ of a transistor becomes lower, if the $V_{ce}$ of the transistor as large as possible, more particularly, in the case where a high-frequency circuit is required.

In another mode, an amplifying circuit is composed of a differential pair of transistors. FIG. 21 is a diagram showing one example of a conventional differential amplifying circuit composed by the differential pair of transistors.

In the diagram, the emitters of a pair of transistors $Q_{11}$ and $Q_{12}$ are connected in common, and connected to the constant current source $I_0$. Further, the collectors of both transistors $Q_{11}$ and $Q_{12}$ are connected to the load resistors $R_{C1}$ and $R_{C2}$, respectively. Furthermore, the load resistors $R_{C1}$ and $R_{C2}$ are connected to the voltage source $V_{CC}$.

In the differential amplifying circuit having the above-described structure, the current $I_{C1}$ flows to the collector of the transistor $Q_{11}$ and the current $I_{C2}$ flows to the collector of the transistor $Q_{12}$ according to the structure. If the current $I_{C1}$ is equal to the current $I_{C2}$, twice amount of current flows in comparison with that of the circuit having a single-end structure formed of the transistor $Q_1$ shown in FIG. 19.

If the current is reduced, the output driving ability becomes lower. When the low impedance load is further connected, the characteristic of the circuit is deteriorated. Accordingly, as shown in FIG. 22, another transistor $Q_{13}$ is connected to be an emitter follower, similarly to the conventional circuit shown in FIG. 19. There have been frequent cases where the load of the differential amplifying circuit is reduced in this fashion.

However, the consumption current becomes larger, in either case, if a larger current flows to the differential amplifying circuit, and if the emitter follower circuit is connected to reduce the current of the differential amplifying circuit.

Further, in the above description of the prior art, the amplifying circuit is formed by transistors. Alternatively, FIG. 23 shows a prior art of the differential amplifying circuit formed by FETs (Field Effect Transistors).

The differential pair is formed by two FETs $T_{11}$ and $T_{12}$, the source terminals of which are mutually connected. Further, the commonly connected source terminals are grounded via the constant current source $I_0$. The consent current source $I_0$ controls the sum $(I_{11}+I_{12})$ of the currents flowing from the drain voltage $V_{d1}$ to two FETs $T_{11}$ and $T_{12}$ so as to become constant.

The gate terminals of the FETs $T_{11}$ and $T_{12}$ are a non-inverse input terminal I and an inverse input terminal /I (hereinafter used /I means inversion of I), respectively, and the terminals are similarly connected to the gate bias voltage $V_g$.

The drain terminals of the FETs $T_{11}$ and $T_{12}$ are connected to the drain voltage $V_{d1}$ via the resistors $R_{11}$ and $R_{12}$, respectively. The drain terminals are connected to the gate terminals of the FETs $T_{13}$ and $T_{14}$, respectively.

The drain terminals of FETs $T_{13}$ and $T_{14}$ are connected to the drain voltage $V_{d2}$, respectively. Further, the source terminals of the FETs $T_{13}$ and $T_{14}$ are grounded via the resistors $R_{13}$ and $R_{14}$, respectively, and simultaneously become a non-inverse output O and an inverse output /O (hereinafter used /0 means inversion of 0), respectively.

In this way, the differential amplifying circuit is symmetrical. The used FETs are also arranged symmetrically, and the current $I_{11}$ flowing to the FET $T_{11}$ is equal to the current $I_{12}$ flowing to the FET $T_{12}$. Simultaneously, the current $I_{13}$ flowing to the FET $T_{13}$ becomes equal to the current $I_{14}$ flowing to the FET $T_{14}$.

In the conventional circuit, the part composed of FETs $T_{11}$ and $T_{12}$, constant current source $I_0$ and resistors $R_{11}$ and $R_{12}$ is a basic differential amplifying circuit. The FETs $T_{13}$ and $T_{14}$ form source follower circuits for matching the output impedance.

Here, the reason for providing the source follower circuit is the same as explained in connection with the conventional circuit shown in FIGS. 19 and 22. More particularly, it is known to use the characteristic impedance of 50 ohms when connecting high frequency circuits. However, the differential amplifying circuit has a high output impedance, so that an amplified signal cannot be outputted effectively, if the output terminal of the amplifying circuit is connected to a circuit having the characteristic impedance of 50 ohms, as it is. Therefore, the source follower circuit is required for conversing the impedance.

In such FET differential amplifying circuit, the difference of two high-frequency signals inputted to the non-inverse input terminal I and the inverse input terminal /I is amplified to output to the non-inverse output terminal O and the inverse output terminal /O, respectively.

The signals outputted from the non-inverse output terminal 0 and the inverse output terminal /0 have phases reversed with same amplitude.

FIG. 24 is a diagram showing the structure of an amplifying circuit formed by using the differential amplifying circuit shown in FIG. 23. As compared with the circuit shown in FIG. 23, the constant current source $I_0$ is replaced with resistor $R_{17}$, and it is grounded via resistors $R_{15}$ and $R_{16}$ instead of the gate bias voltage $V_g$. Accordingly, the circuit realizes a self-biasing system.

According to the FET differential amplifying circuit having the structure shown in FIG. 24, it becomes possible to amplify and output high-frequency signals supplied to the non-inverse input terminal I and the inverse input terminal /I from the non-inverse output terminal O and the inverse output terminal /0, stably.

However, FETs $T_{12}$ and $T_{14}$ are connected to the drain voltages $V_{d1}$ and $V_{d2}$, respectively, as well as FETs $T_{11}$ and $T_{13}$ in the FET differential amplifying circuit shown in FIGS. 23 and 24. Therefore, the consumption current becomes a ground total of the sum $(I_{11}+I_{13})$ of the currents flowing to the FETs $T_{11}$ and $T_{13}$ and the sum $(I_{12}+I_{14})$ of the currents flowing to the FETs $T_{12}$ and $T_{14}$.

Accordingly, the consumption current of the circuit becomes larger. In such amplifying circuit having the above-described structure, it is required to reduce both the sum of $I_{11}+I_{13}$ and the sum of $I_{12}+I_{14}$, in order to make the consumption current lower. Consequently, it brings a problem that the circuit does not sufficiently fulfill its function as a differential amplifier because the gain is reduced.

SUMMARY OF THE INVENTION

Accordingly, it is an object of the present invention to provide an amplifying circuit, which is suitable for an integrated circuit with characteristics of high gain, low-noise and low-current consumption, without losing its amplifying function and which can overcome the problems which are commonly known to the conventional amplifiers as described above in detail.

It is another object of the present invention to provide an amplifying circuit composed of transistors, which can have a low current consumption.

It is still another object of the present invention to provide a differential amplifying circuit having a differential pair of transistors, which is suitable for an integrated circuit with a low current consumption.

It is a further object of the present invention to provide a FET differential amplifying circuit suitable for an integrated circuit (MMIC) that is low-noise and can make the consumption current lower.

The transistor amplifying circuit according to the present invention has a basic structure as follows:

The circuit comprises a first transistor ($Q_2$) having a base coupled to an input terminal, and to which a first base bias ($V_{B1}$) is supplied; a second transistor ($Q_2$) having a collector connected to a voltage source ($V_{CC}$), a base supplied with a second base bias ($V_{B2}$) and an emitter coupled to an output terminal (OUT); a parallel circuit of a constant current source ($I_0$) connected to an emitter of the first transistor ($Q_1$) and a first condenser ($C_E$); an inductor ($I_C$) connected between a collector of the first transistor ($Q_1$) and an emitter of the second transistor ($Q_2$); and a second condenser ($C_c$) connected between the collector of the first transistor ($Q_1$) and the base of the second transistor ($Q_2$).

Further, the transistor differential amplifying circuit according to the present invention has a basic structure as follows:

The circuit comprises a differential pair including first and second transistors, first and second resistors connected to collectors of the first and second transistors and a constant current source connected commonly to emitters of the first and second transistors, a third transistor, an emitter of which is connected to a connection point of first and second inductors; a first condenser connected between the collector of the first transistor and a base of the third transistor; and a voltage source connected to the collector of the third transistor, an output being outputted from the emitter of the third transistor.

Furthermore, the FET differential amplifying circuit according to the present invention has a basic structure as follows:

The circuit comprises a differential pair including first and second FETs; first and second resistors respectively connected to the drains of the first and second FETs and a constant current source connected between a commonly connected source of the first and second FETs and ground; third and fourth FETs, the drains of which are respectively connected to the first and second resistors, a voltage source connected to the sources of the first and fourth FETs; and a gate bias source for supplying gate biases to the gates of the first and second FETs; the drain of the first FET being connected to the gate of the third FET, the drain of the second FET being connected to the gate of the fourth FET and the gates of the first and second FETs being supplied with a non-inverted input and an inverted input, respectively.

Other objects and advantages of the present invention will become apparent from the detailed description to follow taken in conjunction with the appended claims.

BRIEF DESCRIPTION OF THE DRAWINGS

The accompanying drawings, which are incorporated in and constitute a part of the specification, illustrate presently preferred embodiments of the invention, and together with the general description given above and detailed description of the preferred embodiments to follow, explain the principle of the invention.

DESCRIPTION OF THE PREFERRED EMBODIMENTS

Figure 1:
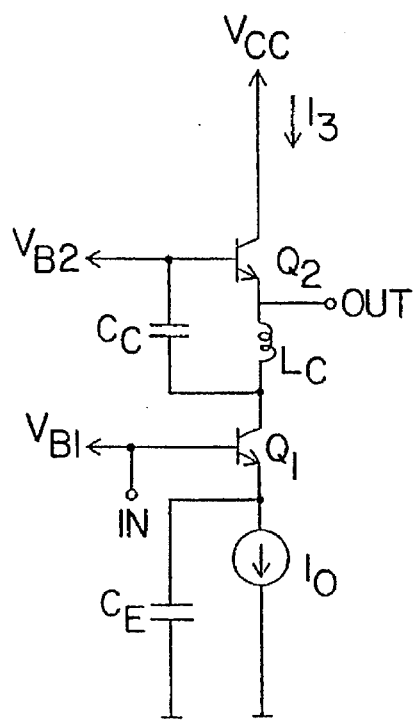
FIG. 1 is a schematic diagram showing a first embodiment of a transistor amplifying circuit according to the present invention.

FIG. 1 is a schematic diagram showing a first embodiment of a transistor amplifying circuit according to the present invention.

In FIG. 1, the circuit has a first transistor $Q_1$ and a second transistor $Q_2$. The transistors $Q_1$ and $Q_2$ are laid lengthwise and are directly connected for a direct current.

A constant current source $I_0$ is connected to an emitter of the first transistor $Q_1$, and a condenser $C_E$ is connected to the emitter of the first transistor $Q_1$ in parallel with condenser $C_E$. A collector of transistor $Q_1$ is connected to an emitter of the transistor $Q_2$ via a load inductor $L_C$.

Further, the collector of the first transistor $Q_1$ is connected to a base of the second transistor $Q_2$ via a condenser $C_C$. The condenser $C_C$ has a function of separating the collector of transistor $Q_1$ from the base of transistor $Q_2$ for a direct current, and connecting them for an alternating current.

The collector of the transistor $Q_2$ is connected to a voltage source $V_{CC}$, and the base of the transistor $Q_2$ is connected to a bias voltage $V_{B2}$. The base of the transistor $Q_1$ is connected to a bias voltage $V_{B1}$.

Furthermore, a signal of high-frequency is inputted to the input terminal IN, that is, the base of the transistor $Q_1$. The high-frequency output amplified is supplied from the collector of the transistor $Q_1$ via the condenser $C_C$ to the base of the transistor $Q_2$, and is outputted from the emitter of the transistor $Q_2$.

In this circuit, the transistor $Q_1$ forms a grounded-emitter type amplifying circuit, and the transistor $Q_2$ forms a grounded-collector type emitter follower amplifying circuit. The inductor $L_C$ becomes a collector load of the transistor $Q_1$.

More particularly, in the circuit according to the present embodiment, the inductor $L_C$ has a high impedance for the frequency that is used. Therefore, the signal amplified by the transistor $Q_1$ can be supplied to the base of the transistor $Q_2$ effectively. Accordingly, loss at high frequency can be prevented.

Further, there is no drop of the direct voltage in the inductor $L_C$, so that voltage $V_{ce}$ between the collector and the emitter of the transistor $Q_1$ can be sufficiently maintained. Therefore, the transistor can be operated without losing the original performance of the transistor.

Figure 19:
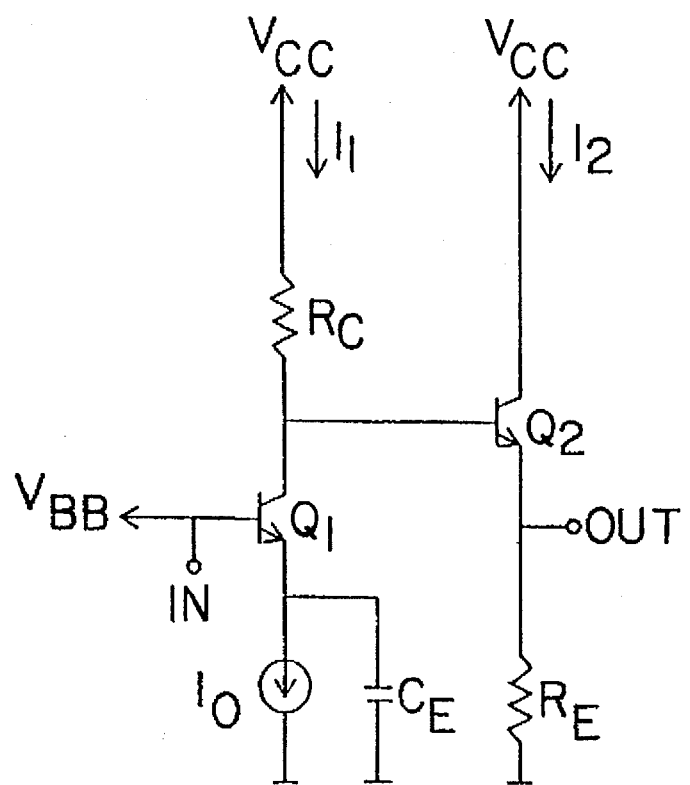
FIG. 19 is a first example of a conventional transistor amplifying circuit.
Figure 21:
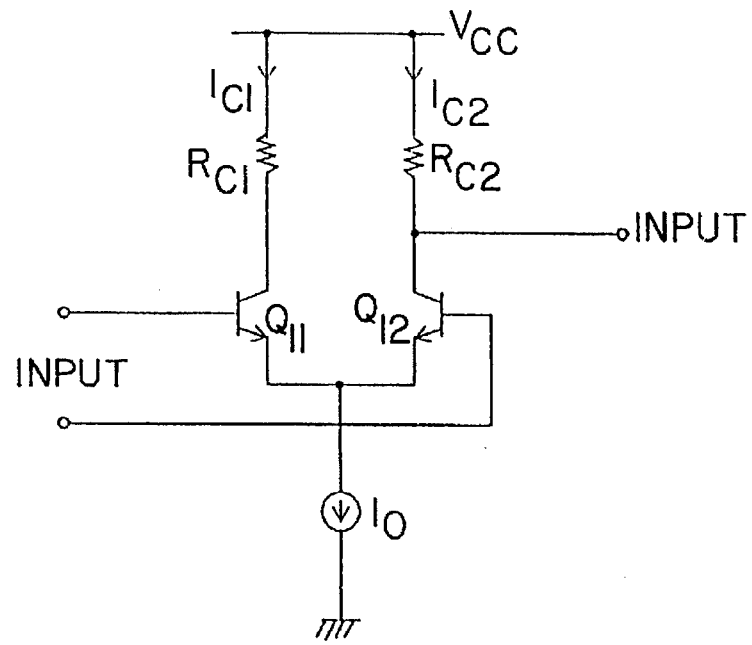
FIG. 21 is a first example of a conventional transistor differential amplifying circuit.

Furthermore, only one circuit is connected to the voltage source $V_{CC}$ as a result by laying the transistors $Q_1$ and $Q_2$ lengthwise in a line, as described above. It becomes possible to make a current $I_3$ flowing to the whole circuit less than the sum of the consumption currents $I_1$ and $I_2$ of the conventional circuit shown in FIGS. 19 and 21.

Figure 2:
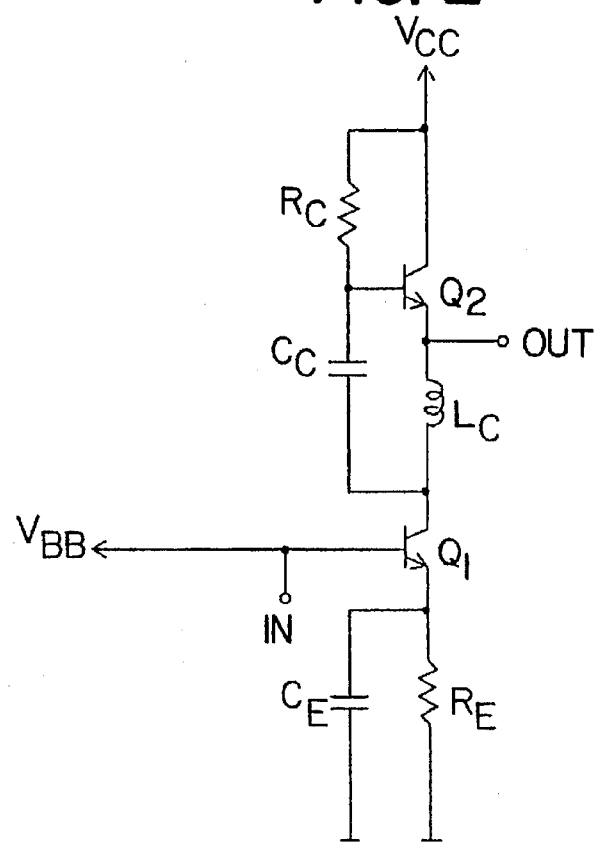
FIG. 2 is a schematic diagram showing a second embodiment of a transistor amplifying circuit according to the present invention.

FIG. 2 shows a second embodiment of the transistor amplifying circuit according to the present invention. As compared with the embodiment shown in FIG. 1, a bias voltage is applied to the base of the transistor $Q_2$ by connecting the base to the voltage source $V_{CC}$ via a resistor $R_C$. Further, the constant current source $I_0$ is formed by the resistor $R_E$.

This circuit is used in the case where it can be operated even if the base potential of the transistor $Q_2$ is higher to some extent. Two voltage sources $V_{CC}$ and $V_{BB}$ can supply the bias required for the whole circuit. Therefore, no bias circuit for biasing the base of the transistor $Q_2$ is necessary, the circuit can be miniaturized, and, the current of the circuit can be made lower.

Figure 3:
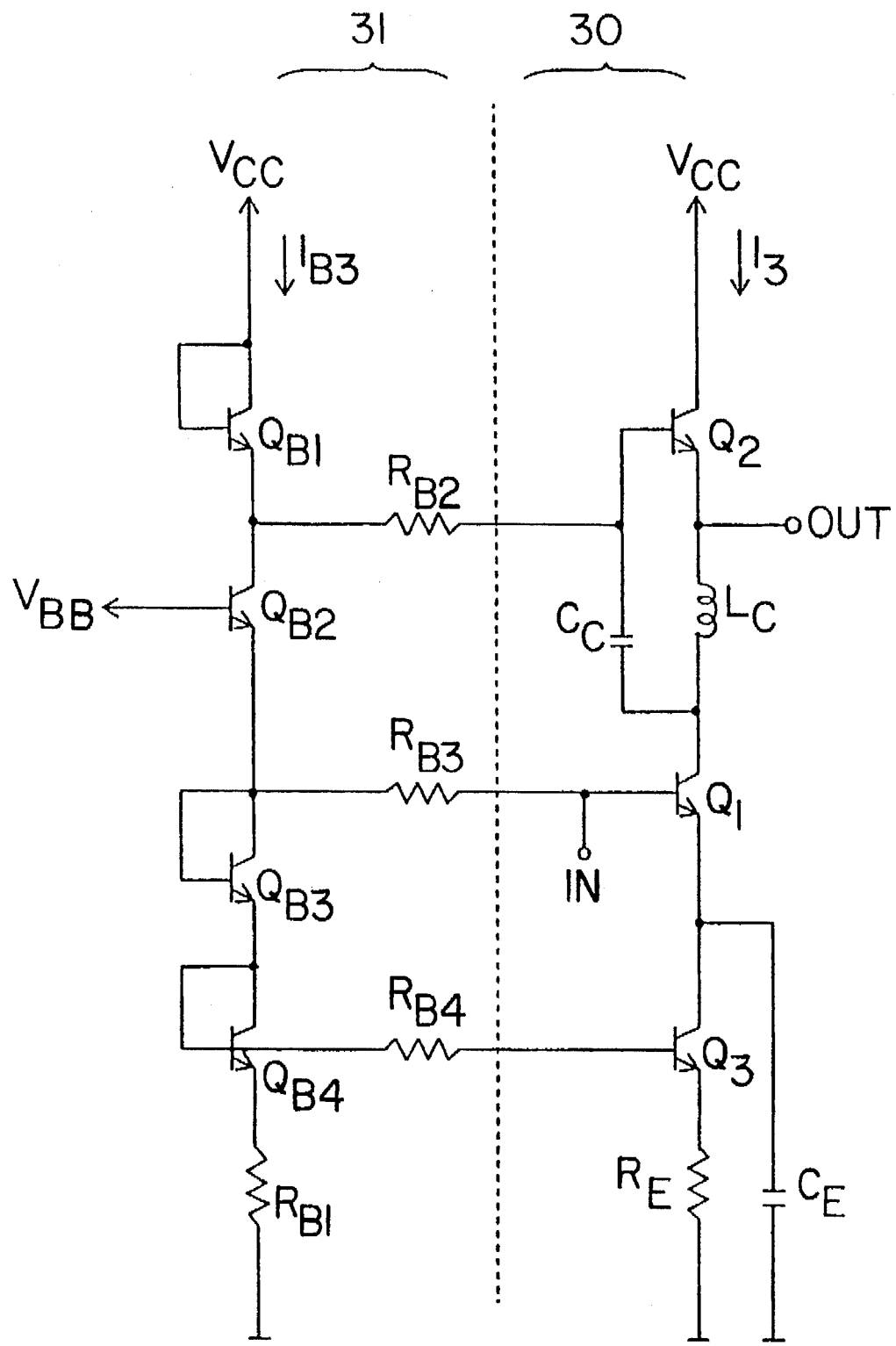
FIG. 3 is a schematic diagram showing a third embodiment of a transistor amplifying circuit having a bias circuit section according to the present invention.

FIG. 3 shows a third embodiment of the transistor amplifying circuit according to the present invention. This circuit has a bias circuit section 31 for supplying required bias voltages on the basis of the transistor amplifying circuit shown in FIG. 1.

In the transistor amplifying circuit section 30, the constant current source $I_0$ is composed of a third transistor $Q_3$ and resistor $R_E$, on the basis of the amplifying circuit shown in FIG. 1.

Consequently, the circuit requires the bias source for supplying the bias voltage to the base of the transistors $Q_1$, $Q_2$ and $Q_3$. The bias circuit section 31 becomes the bias source.

In this bias circuit section 31, each base of the transistors $Q_{B1}$, $Q_{B3}$, and $Q_{B4}$ is connected to each collector of the transistors. Therefore, the transistors function as diodes for shifting voltage.

Further, the transistor $Q_{B2}$ is provided between transistors $Q_{B1}$ and $Q_{B3}$. The base of the transistor $Q_{B2}$ is supplied with a constant voltage $V_{BB}$ from a bias supplying circuit, not shown in the diagram.

In the bias circuit section 31, the constant voltage of voltage source $V_{BB}$ is supplied to the base of the transistor $Q_{B2}$. The transistors $Q_{B1}$, $Q_{B3}$, and $Q_{B4}$ generate voltages required, as voltage level shift circuits, respectively. Accordingly, the required bias voltages are supplied via base bias resistors $R_{B2}$ to $R_{B4}$, to the corresponding bases of the amplifying circuit section 30, which is composed of the transistors $Q_1$, $Q_2$ and $Q_3$ connected lengthwise.

Figure 20:
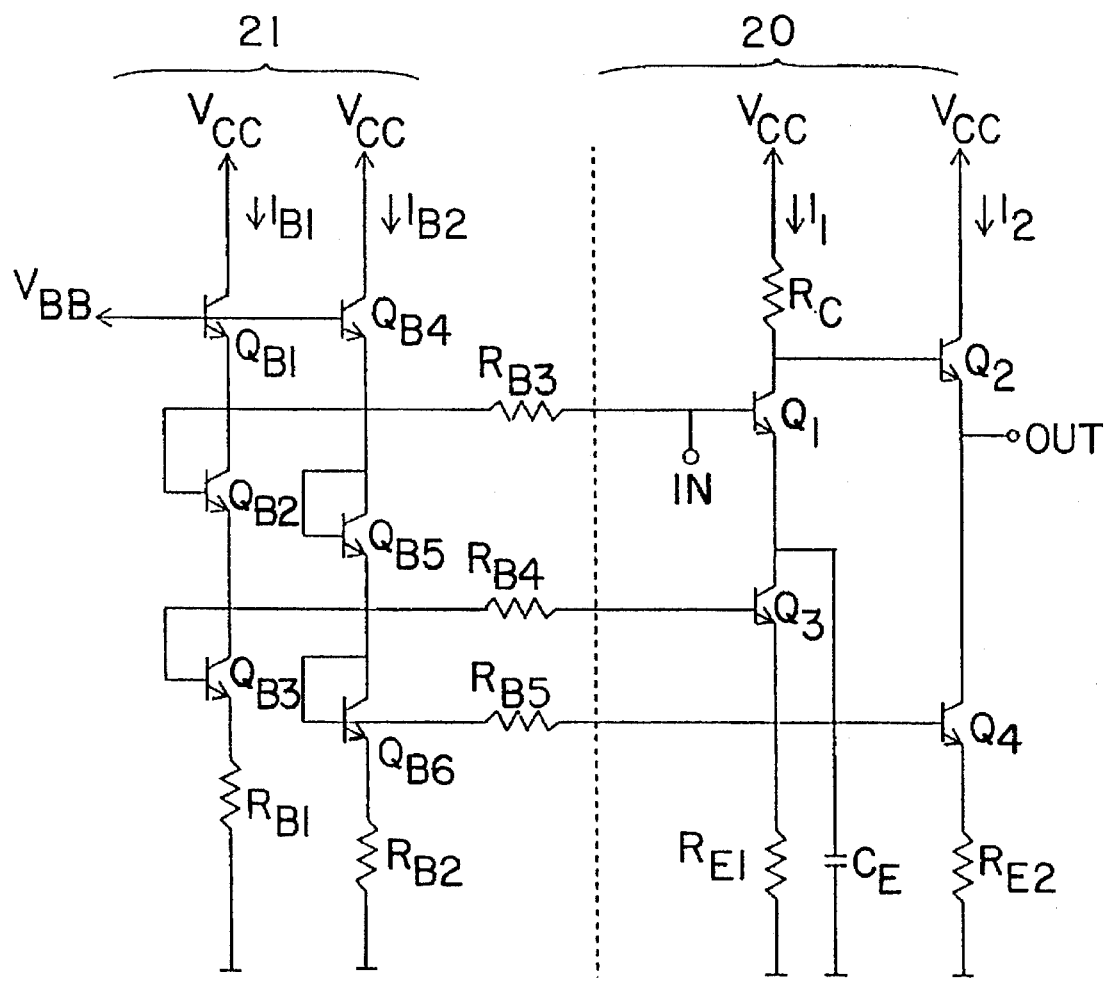
FIG. 20 is a second example of a conventional transistor amplifying circuit having a bias circuit section.

In this way, only one line is connected to the voltage source $V_{CC}$ at last, in the bias circuit section 31, because the bias circuit section 31 has its elements connected lengthwise in a line, similarly to the amplifying circuit section 30. Therefore, it becomes possible that the current $I_{B3}$ flowing to the circuit is less than the sum of the consumption currents $I_{B1}$ and $I_{B2}$ shown in the conventional bias circuit section 21 of FIG. 20.

Figure 4:
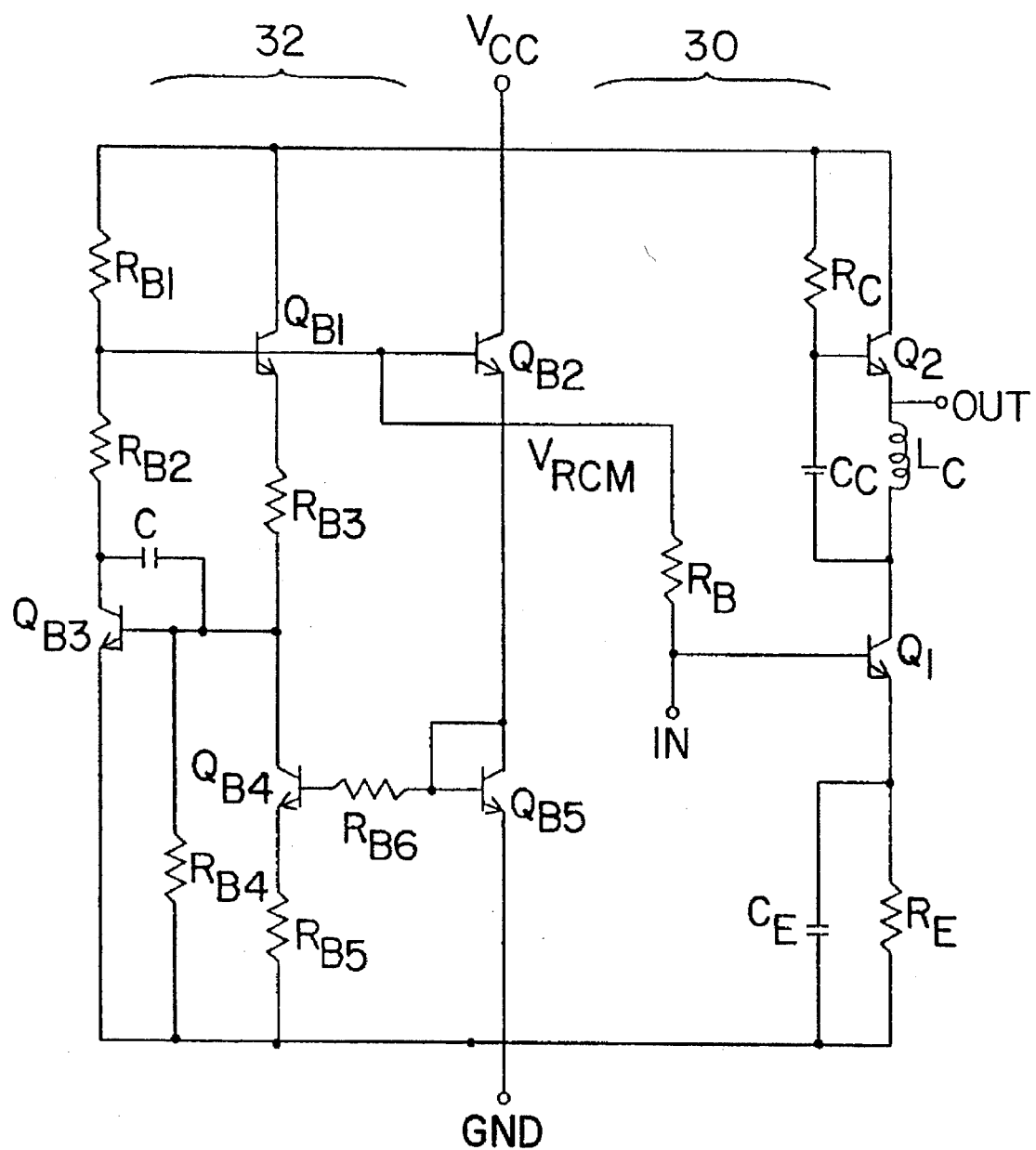
FIG. 4 is a schematic diagram showing a fourth embodiment of a transistor amplifying circuit having a bias circuit section according to the present invention.

FIG. 4 shows a fourth embodiment of the transistor amplifying circuit according to the present invention. This circuit has a bias supplying circuit 32 for supplying required bias voltage on the basis of the amplifying circuit including the bias circuit section 31 shown in FIG. 2.

The amplifying circuit section 30 is the same as the circuit shown in the embodiment of FIG. 2. Accordingly, the required bias voltage is only a base bias supplied to the base of the first transistor $Q_1$. The base bias voltage $V_{rem}$ is supplied via the base bias resistor $R_B$ from the bias supplying circuit 32 to the base of the transistor $Q_1$.

In the embodiment shown in FIG. 4, only one base bias voltage may be supplied, so that there is no need to use the bias circuit section 31 that forms a level shift circuit as explained in connection with the embodiment shown in FIG. 3. This circuit includes only a bias supplying circuit 32 that functions as a constant voltage supplying circuit.

Figure 5:
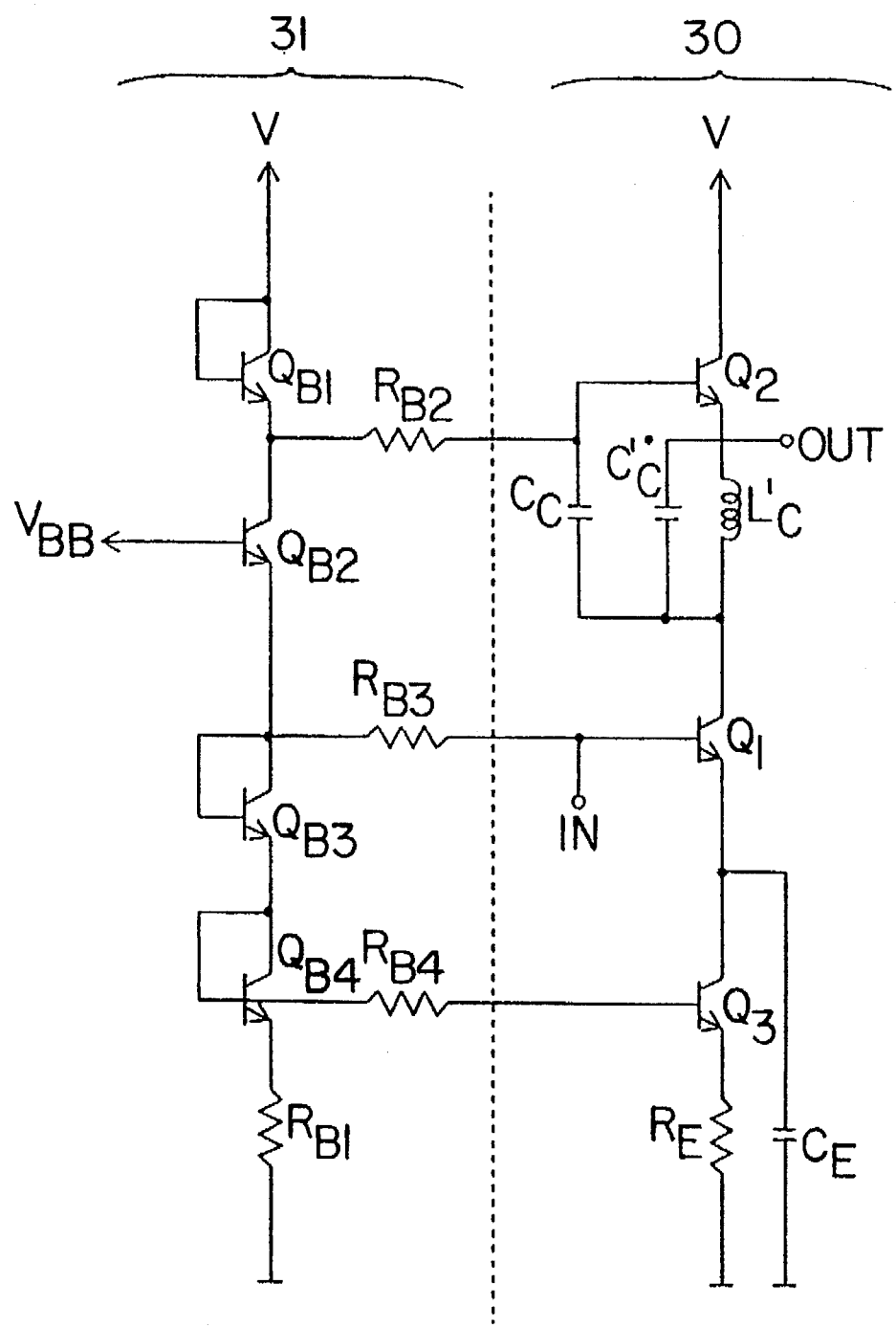
FIG. 5 is a schematic diagram showing a fifth embodiment of a transistor amplifying circuit having a bias circuit section according to the present invention.

FIG. 5 shows a fifth embodiment of the transistor amplifying circuit according to the present invention. The circuit has the bias circuit section 31. The bias circuit section 31 has the same structure as the circuit 31 shown in the embodiment of FIG. 3.

The difference between this embodiment and the embodiment shown in FIG. 3 is that, in order to improve efficiency, a resonant tank circuit is formed with a condenser $C'_c$ and an inductor $L'_C$, instead of the inductor $L_C$ that is inserted to the emitter of the second transistor $Q_2$ in the amplifying circuit section 30. The remaining structure of this circuit is the same as that of the embodiment shown in FIG. 3.

It will be apparent from the above-described embodiments that the transistor amplifying circuit according to the present invention is suitable for an integrated circuit. More particularly, in the case where the transistor amplifying circuit according to the present invention is incorporated in an integrated circuit, the following advantages can be obtained by making the size of emitter $E_{Q1}$ of the transistor $Q_1$ larger than the size of emitter $E_{Q2}$ of the transistor $Q_2$.

That is, emitter current density becomes smaller and the base resistor $R_b$ that is determined according to a physical form is reduced, if the size of the emitter of the transistor is made larger. Therefore, the noise amount NF of the circuit is improved.

Further, the size of the emitter $E_{Q2}$ is made smaller than the size $E_{Q1}$ to make the circuit high impedance for the voltage $V_{CC}$ and prevent the circuit from loss of high frequency. Therefore, it is possible to keep the NF of the amplifying circuit suitable, even if the current is made lower in the circuit, although it is known that it is lowered, and the noise amount NF is deteriorated when the current of a transistor is decreased.

Figure 6:
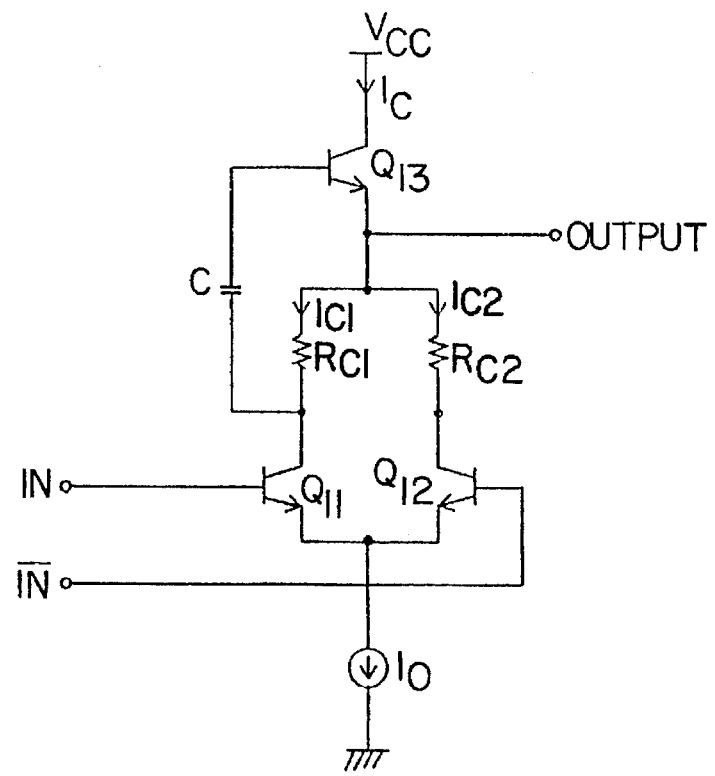
FIG. 6 is a schematic diagram showing a first embodiment of a transistor differential amplifying circuit according to the present invention.

FIG. 6 shows a first embodiment of a transistor differential amplifying circuit according to the present invention. As compared with the conventional transistor differential amplifying circuit shown in FIG. 22, the constant current source $I_0$ is connected in common to an emitter of each of the transistors $Q_{11}$ and $Q_{12}$.

Further, a resistor $R_{C1}$ connected to a collector of the transistor $Q_{11}$ is connected to a resistor $R_{C2}$ connected to a collector of the transistor $Q_{12}$ in common. A transistor $Q_{13}$ forming a buffer circuit is connected between commonly connected resistors $R_{C1}$ and $R_{C2}$ and the voltage source $V_{CC}$ in series for a direct current.

Furthermore, a condenser C is connected between the base of the transistor $Q_{13}$ and one of the transistors $Q_{11}$ and $Q_{12}$ that constitute a differential pair, i.e., the collector of the transistor $Q_{11}$. The condenser C cuts off between the base of the transistor $Q_{13}$ and the collector of the transistor $Q_{11}$, for a direct current, or connects them for an alternative current.

Complementary signals, of which amplitudes are the same and phases of which are reversed, are inputted to the bases of the transistors $Q_{11}$ and $Q_{12}$.

In the circuit explained above, the current $I_C$ flowing to the transistor $Q_{13}$ that forms the buffer circuit diverts into the transistors $Q_{11}$ and $Q_{12}$ that form a differential pair, as it is. Therefore, all current becomes $I_C=I_{C1}+I_{C2}$. As compared with $I_C=I_{C1}+I_{C2}+I_{C3}$ in the case of the conventional circuit shown in FIG. 22, the circuit can make the consumption current lower.

Figure 22:
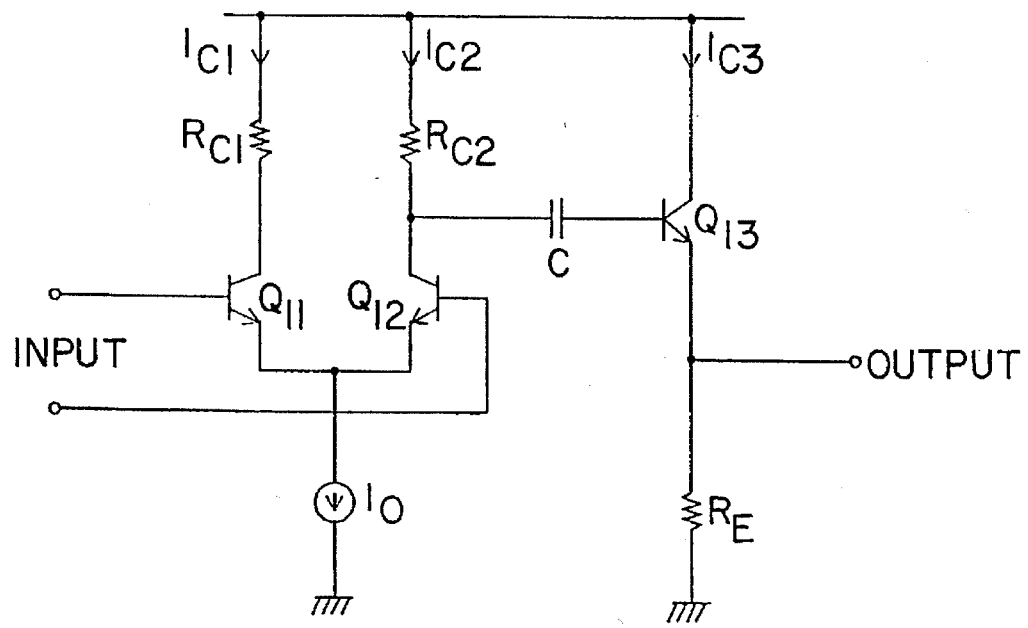
FIG. 22 is a second example of a conventional transistor differential amplifying circuit.

Further, it becomes possible that the emitter resistor $R_E$ required in the conventional circuit shown in FIG. 22 be omitted, so that the structure of the circuit can be made simple.

In the case where transistors of the same emitter size are used as the transistors $Q_{11}$, $Q_{12}$, and $Q_{13}$, the current density of the transistor $Q_{11}$ and $Q_{12}$ becomes smaller in comparison with that of the transistor $Q_{13}$. Simultaneously, it becomes possible to make the noise amount better.

Furthermore, it becomes possible to obtain an amplifying circuit having a large gain, of which noise amount is better by making the emitter size of the transistors $Q_{11}$ and $Q_{12}$ larger than that of the transistor $Q_{13}$.

The transistor $Q_{13}$ does not significantly affect the noise amount. Because of that, it is possible to prevent circuit losses by making the emitter size of the transistor $Q_{13}$ smaller so as to obtain a high impedance for the voltage $V_{CC}$.

Figure 7:
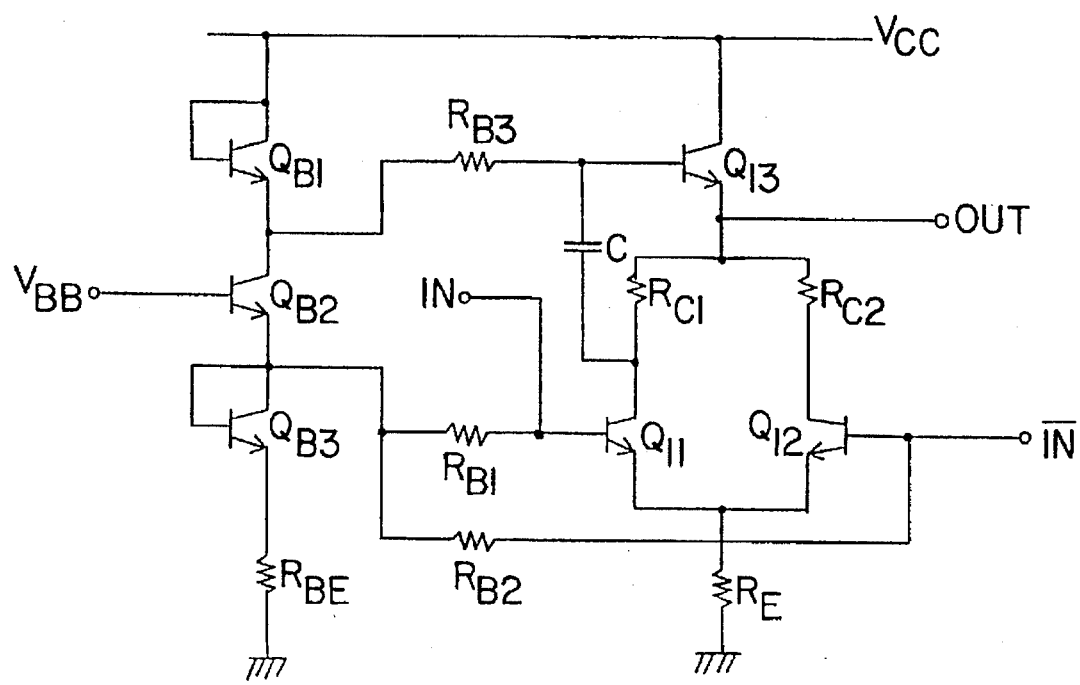
FIG. 7 is a schematic diagram showing a second embodiment of a transistor differential amplifying circuit according to the present invention.

FIG. 7 shows a second embodiment of the transistor differential amplifying circuit according to the present invention. More particularly, it shows a structural example of the transistor differential amplifying circuit provided with a bias circuit section.

Figure 8:
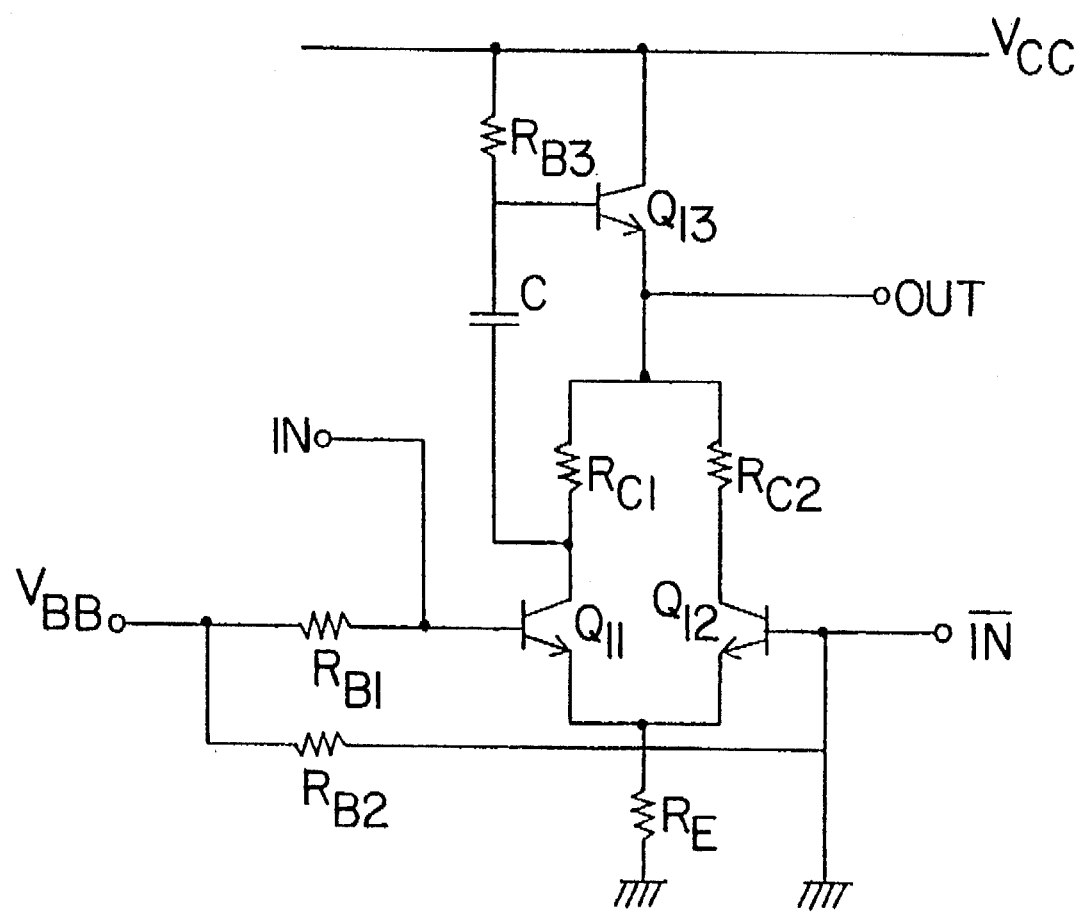
FIG. 8 is a schematic diagram showing a third embodiment of a transistor differential amplifying circuit according to the present invention.

A differential amplifying circuit composed of the transistors $Q_{11}$, $Q_{12}$, and $Q_{13}$ has the same structure as the circuit shown in the embodiment of FIG. 8.

The bias supplying section is composed by the series connected transistors $Q_{B1}$ to $Q_{B3}$ provided between the voltage $V_{CC}$ and the ground and the resistor $R_{BE}$. The transistors $Q_{B1}$ to $Q_{B3}$ are elements that generate the base bias voltages, respectively, for the corresponding transistors $Q_{B1}$ and $Q_{B3}$ are connected to the bases thereof, respectively, to function as diodes for level shifting.

Therefore, the base bias voltages are generated from the bias voltage of one constant voltage source $V_{BB}$.

Simultaneously, the bias voltages are applied via the base resistors $R_{B1}$, $R_{B2}$, and $R_{B3}$ to the bases of the corresponding transistors $Q_{11}$, $Q_{12}$, and $Q_{13}$, respectively.

The bias supplying section in this circuit is also connected to one voltage $V_{CC}$ as well, as explained in connection with FIGS. 3 and 5. Accordingly, it becomes possible to make the structure of the circuit simple and reduce the consumption current.

FIG. 8 shows a third embodiment of the transistor differential amplifying circuit according to the present invention. As compared with the embodiment shown in FIG. 7, resistor $R_{B3}$ is provided between the base of the transistor $Q_{13}$ and the voltage source $V_{CC}$, without obtaining the base bias of the transistor $Q_{13}$ from the bias supplying section. Therefore, the circuit can be made simple.

That is, the circuit from the transistor $Q_{B1}$ to the resistor $R_{B3}$ in the bias supplying section shown in FIG. 7 is omitted, and it also becomes possible that the current flowing in the amplifying circuit be lowered.

Figure 9:
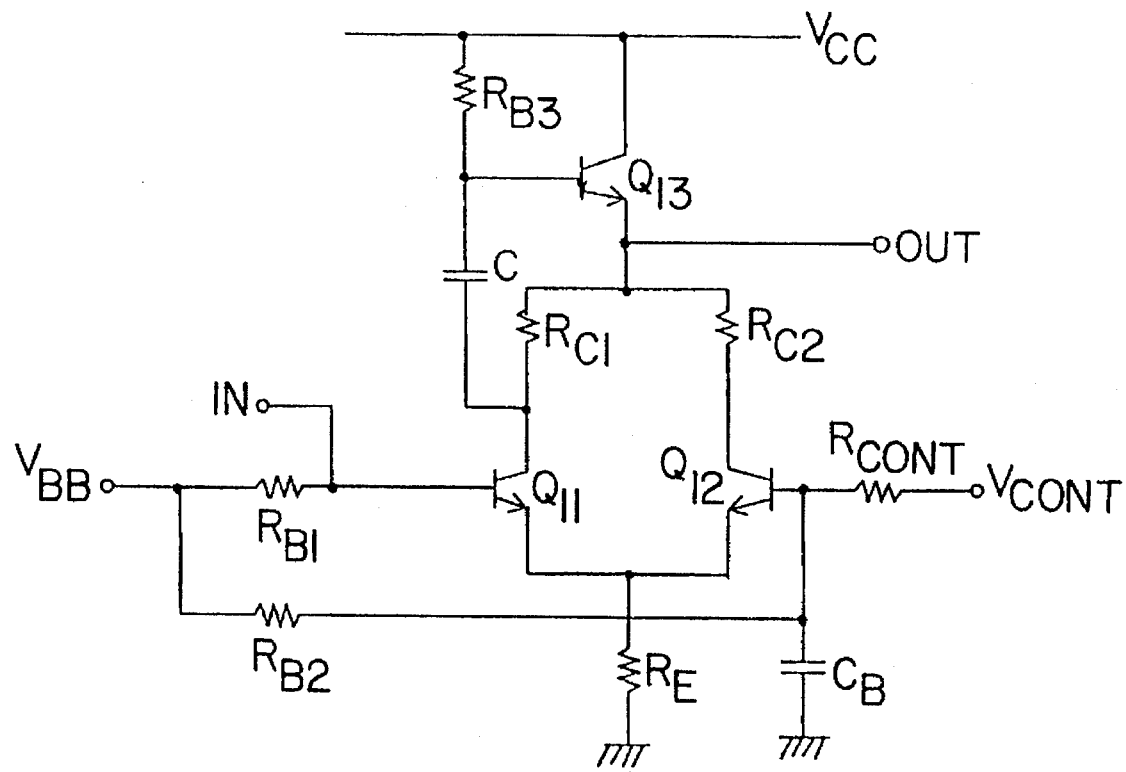
FIG. 9 is a schematic diagram showing a fourth embodiment of a transistor differential amplifying circuit according to the present invention.

FIG. 9 shows a fourth embodiment of the transistor differential amplifying circuit according to the present invention. As compared with the embodiment shown in FIG. 8, a condenser $C_B$ is provided between the base of the transistor $Q_{12}$ and the ground to short cut the input terminal for high frequency and further, the direct bias is controlled by the control signal $V_{CONT}$ supplied to the resistor $R_{CONT}$.

Figure 10:
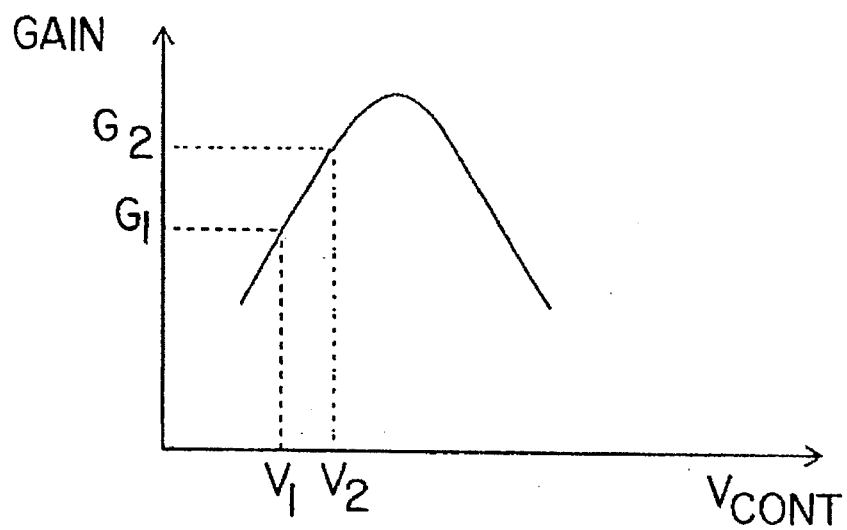
FIG. 10 is a diagram for explaining a control operation of the embodiment shown in FIG. 9.

Accordingly, the gain is changed by the variation of the direct bias, so that the circuit forms a variable gain amplifying circuit, the gain of which is converted by the control signal $V_{CONT}$. As shown in FIG. 10, the gain is changed from $G_1$ to $G_2$, by changing the control signal $V_{CONT}$ from $V_1$ to $V_2$.

Figure 11:
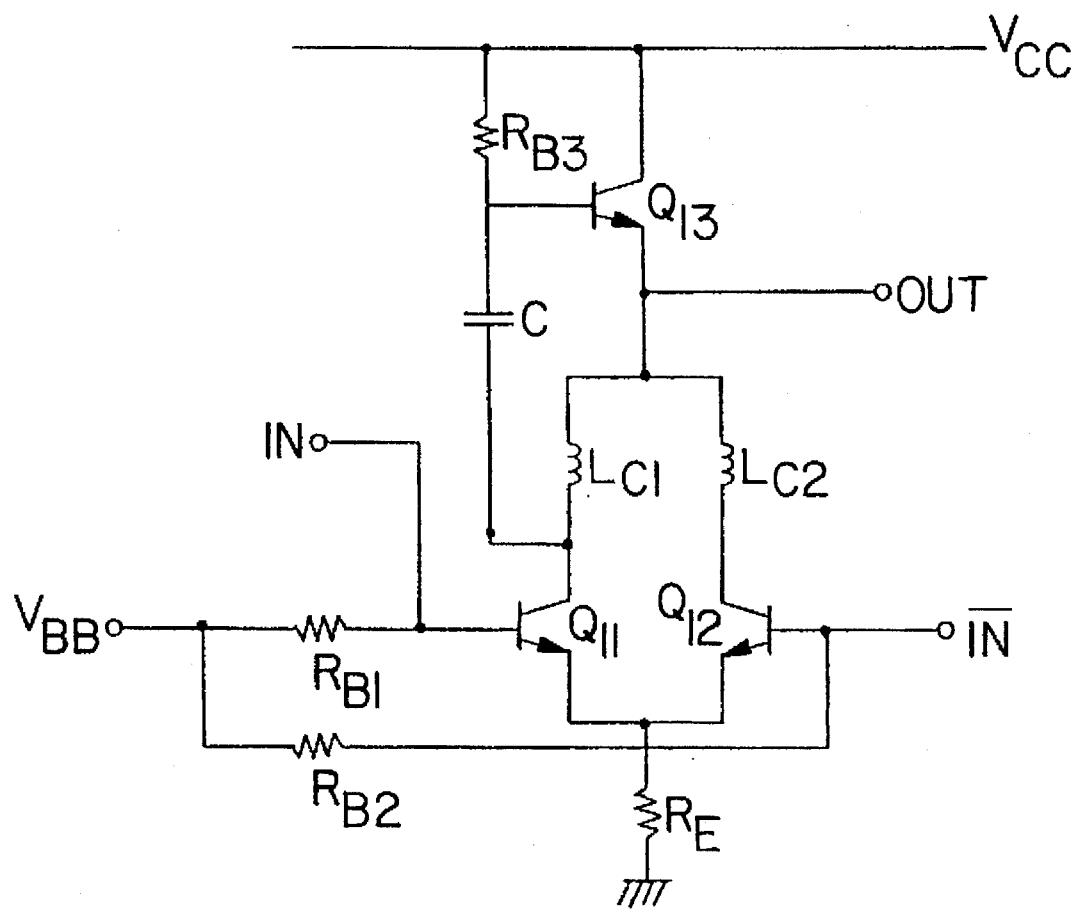
FIG. 11 is a schematic diagram showing a fifth embodiment of a transistor differential amplifying circuit according to the present invention.

FIG. 11 shows a fifth embodiment of the transistor differential amplifying circuit according to the present invention. As compared with the embodiment shown in FIG. 8, the collector resistors $R_{C1}$ and $R_{C2}$ of a pair of transistors $Q_{11}$ and $Q_{12}$ in the differential amplifying circuit are replaced with inductors $L_{C1}$ and $L_{C2}$.

Therefore, the direct-current voltage impressed to each transistor becomes larger, so that the high-frequency differential amplifying circuit that can obtain a high output can be formed.

Although the embodiment of the amplifying circuit using the transistors as amplifying elements and a differential amplifying circuit has been explained, modifications may be made according to this invention by using the basic principles in such circuits. For example, a FET can be used as an amplifying element.

Figure 12:
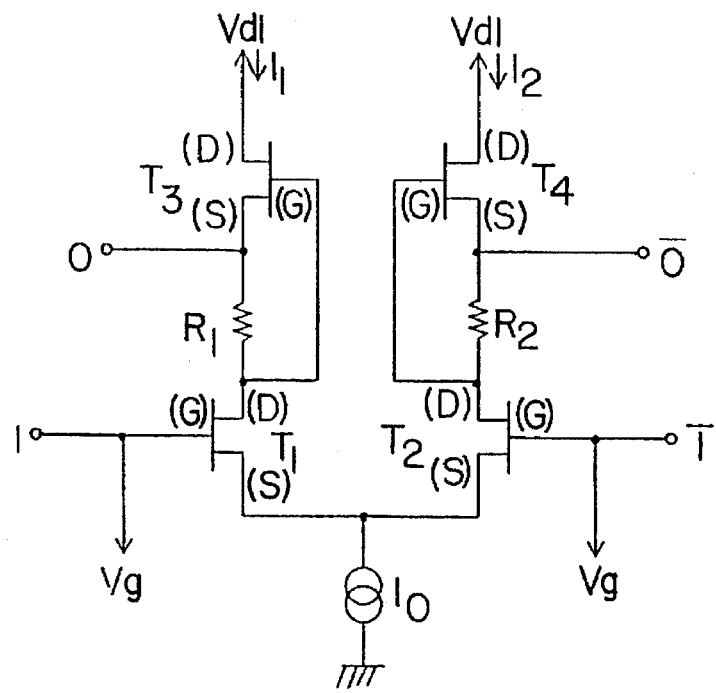
FIG. 12 is a schematic diagram showing a first embodiment of a FET differential amplifying circuit according to the present invention.

FIG. 12 shows a first embodiment of a differential amplifying circuit using FETs, according to the present invention.

The FET differential amplifying circuit is composed of a differential pair of two FETs $T_1$ and $T_2$, and FETs $T_3$ and $T_4$ for a source follower provided at each drain terminal of the differential pair, which are laid lengthwise in a line, for one voltage $V_{d1}$.

That is, as shown in FIG. 12, the differential pair is formed by commonly connecting the source terminals of two FETs $T_1$ and $T_2$, and the common source terminal connected to the constant current source $I_0$ is grounded.

The gate terminals of the FETs $T_1$ and $T_2$ make the non-inverse input terminal I and inverse input terminal /I, respectively, and together, the gate terminals are connected to the gate bias voltage $V_g$. The drain terminals of the FETs $T_1$ and $T_2$ are connected to the source terminals of the FETs $T_3$ and $T_4$ via the resistors $R_1$ and $R_2$.

The drain terminals of the FETs $T_3$ and $T_4$ are connected to the voltage $V_{d1}$, respectively. Further, the source terminals of the FETs $T_3$ and $T_4$ become the non-inverse output terminal 0 and the inverse output terminal /0.

In the FET differential amplifying circuit having such a structure as explained, the FETs $T_1$ and $T_2$ form a differential amplifying circuit, and the FETs $T_3$ and $T_4$ respectively form source follower circuits. Further, the resistors $R_1$ and $R_2$ are drain load resistors of the FETs $T_1$ and $T_2$ for a direct current, respectively. Simultaneously, the load resistors become the source resistors of FETs $T_3$ and $T_4$.

Further, the drain terminals of the FETs $T_1$ and $T_2$ are directly connected to the gate terminals of the FETs $T_3$ and $T_4$, respectively. It is because a voltage is supplied to the gate terminal in the case of using a FET, so that the current would not flow. Accordingly, each drain terminal of the FETs $T_1$ and $T_2$ becomes of the same potential as the gate terminals of the FETs $T_3$ and $T_4$. Therefore, this embodiment is different from the embodiment of the amplifying circuit employing transistors, so that it becomes useless to use any condenser for impeding a direct current.

The signals outputted from the drain terminals of the FETs $T_1$ and $T_2$, such as a high-frequency signal, are supplied to the gate terminals of the FETs $T_3$ and $T_4$ and outputted from the source terminals of the FETs $T_3$ and $T_4$.

Meanwhile, as described in connection with FIGS. 23 and 24, in the conventional circuit, the voltages $V_{d1}$ and $V_{d2}$ were required for the differential amplifying circuit composed of the FETs $T_1$ and $T_2$ and the source follower circuits composed of the FETs $T_3$ and $T_4$, respectively. Therefore, the consumption current becomes the sum of the currents $I_{11}$ and $I_{12}$ flowing to the differential amplifying circuit and the currents $I_{13}$ and $I_{14}$ flowing to the source follower circuits.

As compared with the conventional circuit, as described above, the circuit of the present invention is formed by laying the right-side and the left-side circuits in the differential amplifying circuit lengthwise in a line, respectively. Accordingly, only one voltage $V_{d1}$ can be used as compared with the circuit shown in FIGS. 23 and 24. Therefore, the current can be reduced to nearly half as used as the currents $I_1$ and $I_2$ flowing through the circuit.

Figure 13:
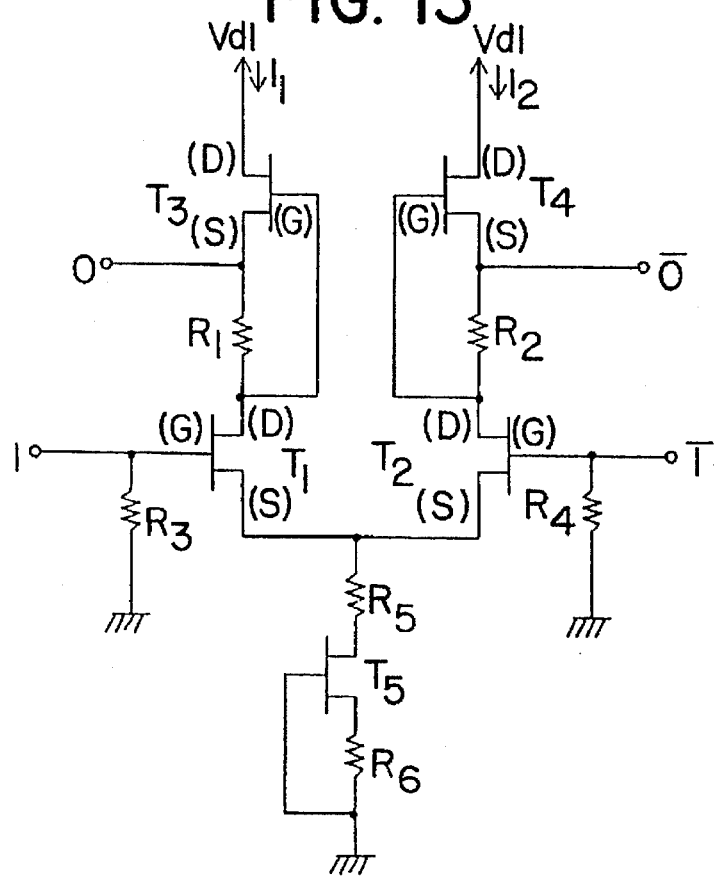
FIG. 13 is a schematic diagram showing a more specific first structural example of the embodiment shown in FIG. 12.

FIG. 13 shows a schematic diagram showing a first structural example of the first embodiment of a FET differential amplifying circuit shown in FIG. 12.

That is, in the circuit shown in FIG. 13, the constant current source $I_0$ is formed by a series circuit composed of resistors $R_5$ and $R_6$ and the FET $T_5$ as compared with the FET differential amplifying circuit shown in FIG. 12. The drain terminal of the FET $T_5$ is connected to the source terminals of the FETs $T_1$ and $T_2$, via resistor $R_5$. Further, the source terminal of the FET $T_5$ is grounded via the resistor $R_6$. Simultaneously, the gate terminal is grounded directly.

Further, the circuit forms the self-bias system by grounding the gate terminals via the resistors $R_3$ and $R_4$, respectively, instead of the gate bias voltage $V_g$ for supplying to the gate terminals of the FETs $T_1$ and $T_2$.

In the circuit having the above-described structure, the voltage $V_g$ becomes useless, and it becomes possible to operate the circuit with only one voltage $V_{d1}$. Further, this circuit forms two complementary inputs and two complementary outputs.

Figure 14:
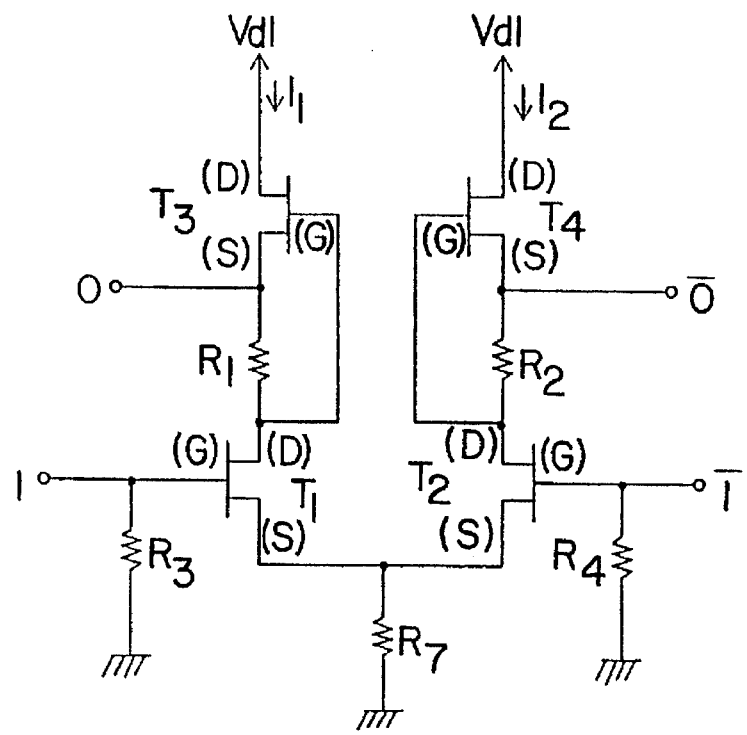
FIG. 14 is a schematic diagram showing a more specific second structural example of the embodiment shown in FIG. 12.

FIG. 14 shows a schematic diagram showing a second specific structure of the first embodiment of the FET differential amplifying circuit shown in FIG. 12.

Same as the structural example shown in FIG. 13, the circuit of FIG. 14 forms two complementary inputs and two complementary outputs. The circuit forms the self-bias system by grounding the gate terminals via the resistors $R_3$ and $R_4$, respectively, instead of supplying the gate bias voltage $V_g$ to the gate terminals of the FETs $T_1$ and $T_2$.

In the circuit of FIG. 14, the constant current source $I_0$ is replaced with only resistor $R_7$. If stability is not required exactly, it is possible to use only such one resistor, instead of the constant current source $I_0$.

Figure 15:
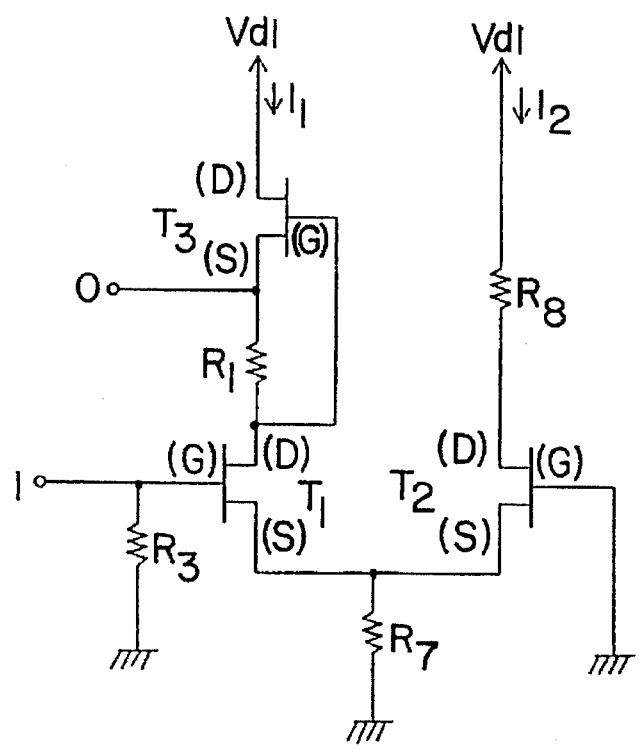
FIG. 15 is a schematic diagram showing a second embodiment of a FET differential amplifying circuit according to the present invention.

FIG. 15 shows a second embodiment of the FET differential amplifying circuit according to the present invention. This circuit forms one single input and one single output. A resistor $R_7$ has replaced the current source $I_0$ of the FET differential amplifying circuit shown in the embodiment of FIG. 12, similarly to the circuit shown in FIG. 14.

Further, the FET $T_1$ is grounded via the resistor $R_3$ instead of supplying the gate bias voltage $V_g$ to the gate terminals of the FETs $T_1$ and $T_2$. Meanwhile, the inverse input is not used in the FET $T_2$, so that the FET $T_2$ forms the self-bias system by grounding the gate directly.

In this circuit, the inverse output of the right side of the circuit is not used. Therefore, the resistor $R_8$ is used instead of the FET $T_4$ and the resistor $R_2$ shown in FIG. 12.

Figure 16:
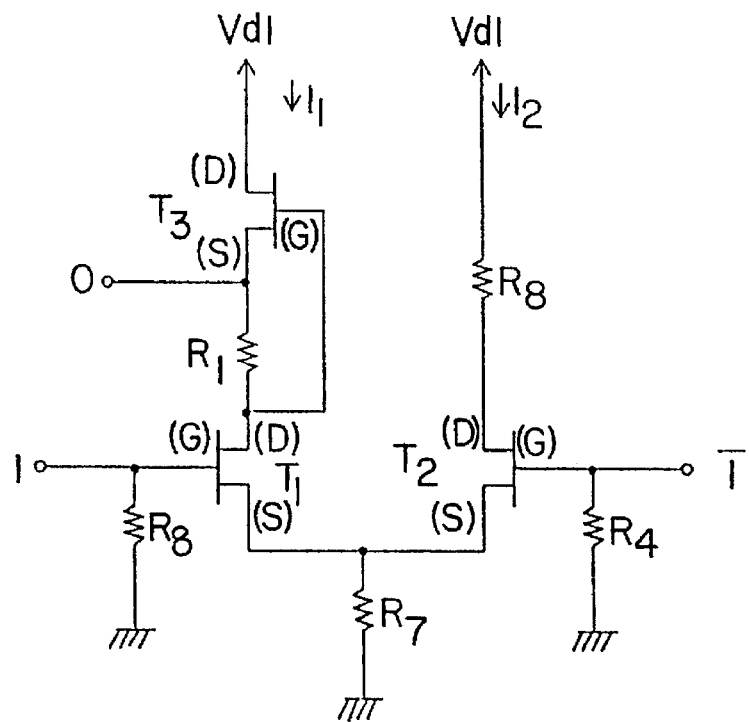
FIG. 16 is a schematic diagram showing a third embodiment of a FET differential amplifying circuit according to the present invention.

FIG. 16 shows a third embodiment of the FET differential amplifying circuit according to the present invention. This circuit has two complementary inputs and the single output. The resistor $R_7$ has replaced the current source $I_0$ of the FET differential amplifying circuit shown in the embodiment of FIG. 12, same as in the circuit of FIG. 14.

Further, the FET $T_1$ is grounded via the resistor $R_3$ instead of supplying the gate bias voltage $V_g$ to the gate terminals of FETs $T_1$ and $T_2$. Meanwhile, the FET $T_2$ to which the inverse input is applied forms a self-bias system, in which the FET $T_2$ is grounded via the resistor $R_4$.

In this circuit, the inverse output of the right side of the circuit is not used. The resistor $R_8$ has replaced the FET $T_4$ and the resistor $R_2$.

Figure 17:
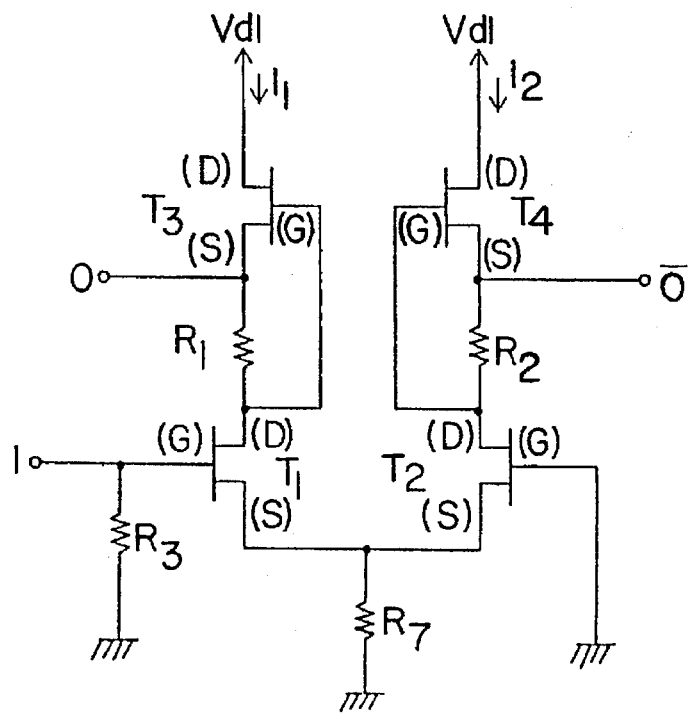
FIG. 17 is a schematic circuit showing a fourth embodiment of a FET differential amplifying circuit according to the present invention.

FIG. 17 shows a fourth embodiment of the FET differential amplifying circuit according to the present invention. This circuit forms the single input and two complementary outputs. The resistor $R_7$ has replaced the current source $I_0$ of the FET differential amplifying circuit shown in the embodiment of FIG. 12, same as in the circuit shown in FIG. 14.

Further, the FET $T_1$ is grounded via the resistor $R_3$ instead of supplying the gate bias voltage $V_g$ to the gate terminals of the FETs $T_1$ and $T_2$. Meanwhile, the inverse input is not used in the FET $T_2$, so that the circuit forms the self-bias system by connecting the gate of the FET $T_2$ directly to the ground.

Figure 18:
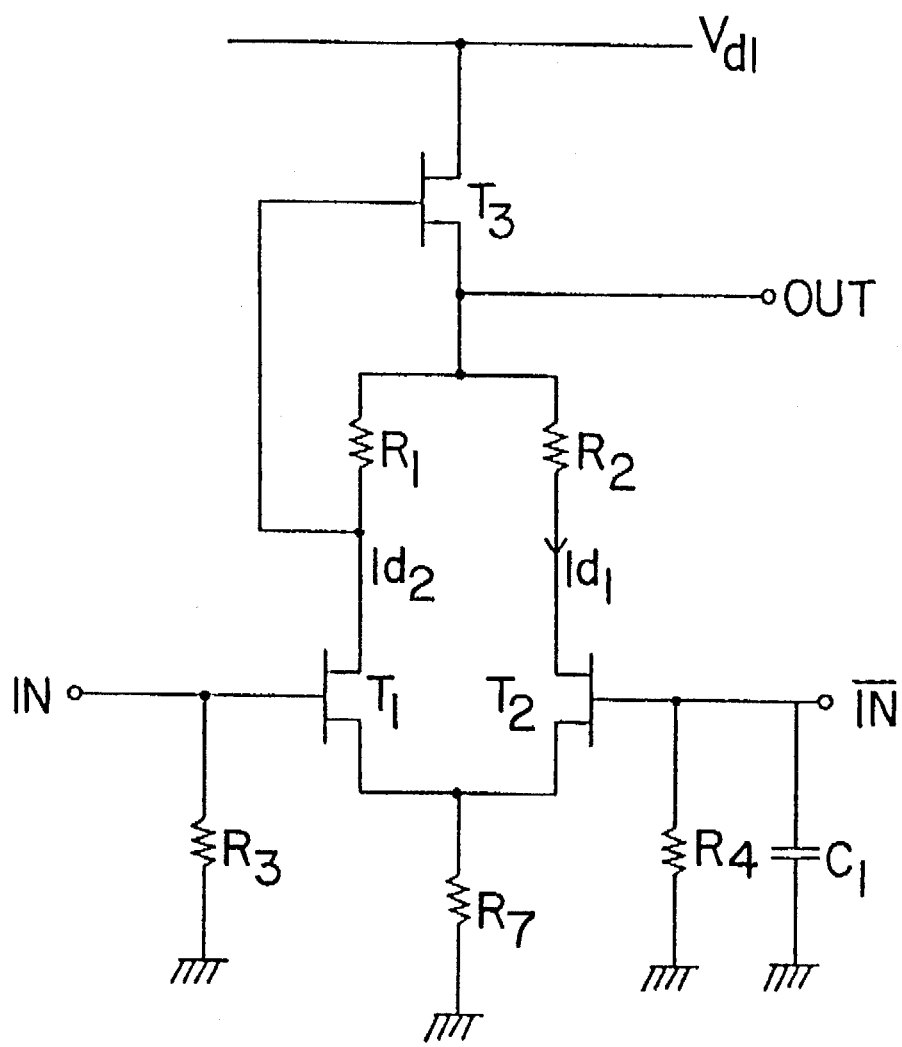
FIG. 18 is a schematic circuit showing a fifth embodiment of a FET differential amplifying circuit according to the present invention.

FIG. 18 shows a fifth embodiment of the FET differential amplifying circuit according to the present invention. The circuit forms two inputs and the single output. In this embodiment, the load resistors $R_1$ and $R_2$ of the differential pair of FETs $T_1$ and $T_2$ are connected in common, and the FET $T_3$ is inserted between the connecting point of the resistors $R_1$ and $R_2$ and the voltage source $V_{d1}$.

Further, the gate terminal of the FET $T_3$ is directly connected to the drain terminal of the FET $T_1$, that is, one of the differential pair of the FETs $T_1$ and $T_2$.

Accordingly, the FET $T_3$ works as a source follower circuit. The gate terminals of the FETs $T_1$ and $T_2$ become the non-inverse input terminal I and the inverse input terminal /I, respectively. The self-bias is applied to the gate terminals by the resistors $R_3$ and $R_4$.

In the embodiment shown in FIG. 18, only the FET $T_3$ is provided between the differential pair of the FETs $T_1$ and $T_2$ and the voltage source to further simplify the structure of the circuit.

Figure 23:
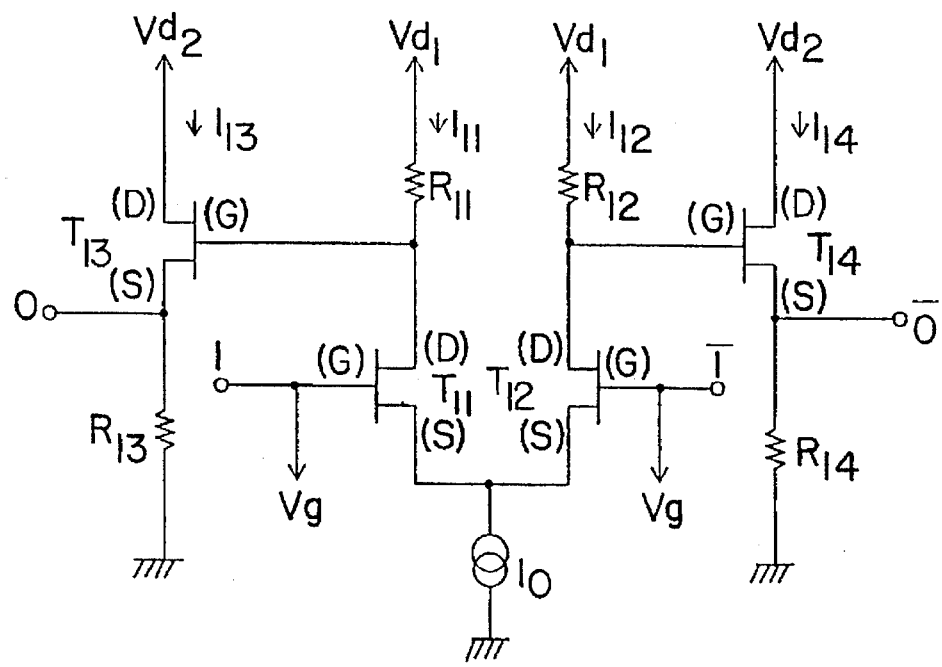
FIG. 23 shows a prior art of a FET differential amplifying circuit.
Figure 24:
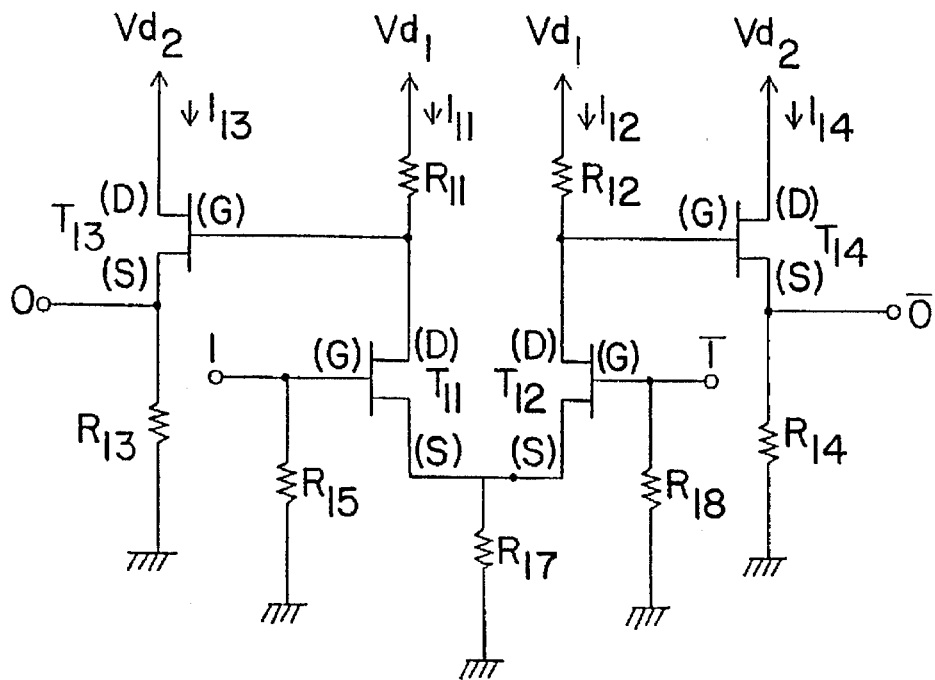
FIG. 24 shows a specific structural example of the conventional circuit shown in FIG. 23.

According to the FET differential amplifying circuits having the structures shown in FIGS. 12 through 18 as described above, the current $I_1$ and the current $I_2$ flowing to the circuit become approximately half the current $I_{11}+I_{13}$ and the current $I_{12}+I_{14}$, in comparison with the conventional FET differential amplifying circuits shown in FIGS. 23 and 24.

Also, it is known that a GaAs (gallium arsenide) FET is used more often as a FET in the high-frequency circuit. In the case where the amplifying circuit according to the present invention is integrated, the circuit can be a MMIC (Monolithic microwave integrated circuit) comprising FETs and resistors unitedly on a gallium arsenide wafer.

Further, it becomes possible to make the noise lower and make the consumption current lower in the differential amplifying circuit by using a HEMT (High Electron Moving Transistor), in which noise is lower than that of the GaAs FET used as a FET.

According to the present invention the amplifying circuit of which noise is lower and consumption current is lower can be obtained. Further, amplifying elements such as transistors, FETs or HEMTs can be used according to the principle of the present invention.

Therefore, it is possible to apply the present invention to each kind of amplifying circuits, that are indispensable in compact type handy machines, and particularly, portable telephones. Thus, it is apparent that the present invention greatly contributes to industrial efficiency.

Although the present invention has been described with reference to embodiments, the present invention is not restricted to those. It should be, of course, understood that those embodiments which are the same as the technical concept of the invention are within the protective scope of this invention.

What is claimed is:

1. A transistor amplifying circuit comprising:

a first transistor having a base of an input terminal, to which a first base bias is supplied, a second transistor having a collector connected to a voltage source, a base supplied with a second base bias and an emitter of an output terminal, a parallel circuit of a constant current source connected to an emitter of the first transistor and a first condenser, an inductor connected between a collector of the first transistor and an emitter of the second transistor; and a second condenser connected between the collector of the first transistor and the base of the second transistor.

2. A transistor amplifying circuit according to claim 1, further comprising a resistor, which connects the base of the second transistor to the voltage source.

3. A transistor amplifying circuit according to claim 1, wherein the constant current source is a resistor, which is connected to the second condenser in parallel.

4. A transistor amplifying circuit according to claim 1, wherein the constant current source is a series circuit of a third transistor and the resistor connected to an emitter of the third transistor, and the series circuit is connected to the second condenser in parallel.

5. A transistor amplifying circuit according to claim 1, further comprising a third condenser connected to the inductor in parallel to form a resonant tank circuit.

6. A transistor amplifying circuit according to claim 1, further comprising a bias circuit section that includes a voltage level shift circuit having a plurality of diodes connected in series, of which one end is connected to the voltage source, for providing predetermined potentials, which are supplied to the bases of the first through third transistors.

7. A transistor amplifying circuit according to claim 6, further comprising a forth transistor, which is inserted in the voltage level shift circuit and a base of which is supplied with a predetermined voltage.

8. A transistor amplifying circuit according to claim 1, wherein the base of the first transistor is supplied with a high frequency signal and a high frequency output signal is outputted from the emitter of the second transistor.

9. A semiconductor device having a semiconductor integrated circuit, comprising;

a first transistor having a base of an input terminal, to which a first base bias is supplied, a second transistor having a collector connected to a voltage source, a base supplied with a second base bias and an emitter of an output terminal, a parallel circuit of a constant current source connected to an emitter of the first transistor and a first condenser, an inductor connected between a collector of the first transistor and an emitter of the second transistor; and a second condenser connected between the collector of the first transistor and the base of the second transistor, wherein the size of the emitter of the first transistor is larger than that of the second transistor.

10. A transistor differential amplifier circuit comprising:

a differential pair including first and second transistors, first and second resistors connected to collectors of the first and second transistors and a constant current source connected commonly to emitters of the first and second transistors;

a third transistor, an emitter of which is connected to a connection point of the first and second resistors and outputs an output signal;

a first condenser connected between the collector of the first transistor and a base of the third transistor; and a voltage source connected directly to a collector of the third transistor.

11. A transistor differential amplifying circuit according to claim 10, further comprising;

third and fourth resistors, a constant voltage source for providing base biases to the bases of the first and second transistors via the third and fourth resistors, respectively, a fifth resistor connected between the base of the third transistor and the voltage source for providing a base bias to the base of the third transistor from the voltage source.

12. A transistor differential amplifier circuit comprising;

a differential pair including first and second transistors, first and second inductors connected to collectors of the first and second transistors and a constant current source connected commonly to emitters of the first and second transistors, a third transistor, an emitter of which is connected to a connection point of the first and second inductors, a first condenser connected between the collector of the first transistor and a base of the third transistor; and a voltage source connected to the collector of the third transistor, an output being outputted from the emitter of the third transistor.

13. A transistor amplifying circuit comprising:

a differential pair including first and second transistors, a base of the first transistor being supplied with an input signal and a base of the second transistor being supplied with a control signal, first and second resistors connected to collectors of the first and second transistors, and a constant current source connected commonly to emitters of the first and second transistors;

a third transistor, an emitter of which is connected to a connection point of the first and second resistors and outputs an output signal;

a first condenser connected between the collector of the first transistor and a base of the third transistor;

a second condenser connected between the base of the second transistor and the ground;

a voltage source connected directly to the collector of the third transistor;

third and fourth resistors;

a constant voltage source for providing base biases to the bases of the first and second transistors via the third and fourth resistors, respectively; and a fifth resistor connected between the base of the third transistor and the voltage source for providing a base bias to the base of the third transistor from the voltage source.

14. A transistor amplifying circuit comprising:

a differential pair including first and second transistors, first and second resistors connected to collectors of the first and second transistors, and a constant current source connected commonly to emitters of the first and second transistors;

a third transistor, an emitter of which is connected to a connection point of the first and second resistors and outputs an output signal;

a first condenser connected between the collector of the first transistor and a base of the third transistor; and a voltage source connected directly to the collector of the third transistor, wherein the sizes of the first and second transistors are same and the size of the third transistor is smaller than that of the first and second transistors.

* * * * *